(12) United States Patent
Ando et al.

(10) Patent No.: US 6,373,708 B1
(45) Date of Patent: Apr. 16, 2002

(54) CONTACTLESS IC CARD

(75) Inventors: Kimiaki Ando, Hamura; Takehiro Ohkawa, Kunitachi; Kazuo Kaneko, Yokohama, all of (JP)

(73) Assignees: Hitachi, Ltd.; Hitachi Chemical Co., Ltd., both of Tokyo (JP)

( * ) Notice: Subject to any disclaimer, the term of this patent is extended or adjusted under 35 U.S.C. 154(b) by 0 days.

(21) Appl. No.: 09/373,722

(22) Filed: Aug. 13, 1999

Related U.S. Application Data

(62) Division of application No. 09/010,184, filed on Jan. 21, 1998, now Pat. No. 5,999,409.

(30) Foreign Application Priority Data

Jan. 28, 1997 (JP) .............................................. 9-013650

(51) Int. Cl.⁷ .............................. H05K 1/14; H01Q 1/36; G06K 19/067
(52) U.S. Cl. ........................ 361/737; 343/895; 235/492
(58) Field of Search .................................. 361/728, 736, 361/737, 748, 794; 343/742, 867, 895; 235/492

(56) References Cited

U.S. PATENT DOCUMENTS

| | | | |
|---|---|---|---|
| 4,583,099 A | * | 4/1986 | Reilly et al. ................ 343/895 |
| 4,795,898 A | | 1/1989 | Bernstein et al. |
| 4,926,292 A | * | 5/1990 | Maple ......................... 361/765 |
| 5,237,165 A | | 8/1993 | Tingley, III |
| 5,399,847 A | | 3/1995 | Droz |
| 5,424,527 A | | 6/1995 | Takahira |
| 5,436,441 A | | 7/1995 | Inoue |
| 5,457,469 A | * | 10/1995 | Diamond et al. ........... 343/730 |
| 5,598,032 A | | 1/1997 | Fidalgo |
| 5,640,004 A | | 6/1997 | Mardinian et al. |
| 5,966,063 A | * | 10/1999 | Sato et al. .................. 336/200 |

FOREIGN PATENT DOCUMENTS

| | | | |
|---|---|---|---|
| JP | 404294613 A | * | 10/1992 |
| JP | 7-120237 | | 5/1995 |
| JP | 8-216570 | | 8/1996 |
| JP | 408203737 A | * | 8/1996 |

* cited by examiner

*Primary Examiner*—Jayprakash N. Gandhi
(74) *Attorney, Agent, or Firm*—Mattingly, Stanger & Malur, P.C.

(57) ABSTRACT

The pattern line width of a coil is partially widened in a predetermined dimension and wiring patterns of a coil on the surface side and a coil on the rear side are arranged so as not to be in overlapped positions. Consequently, a direct current resistance of the coil can be reduced and an adverse influence by a self resonance of the coil on a communication can be reduced.

18 Claims, 7 Drawing Sheets

CONTACTLESS IC CARD

This is a divisional application of U.S. Ser. No. 09/010,184, filed Jan. 21, 1998.

BACKGROUND OF THE INVENTION

The present invention relates to a contactless IC card for receiving power and for receiving/transmitting signals from/to a reader/writer as an upper terminal by electromagnetic coupling. More particularly, the invention relates to the structure of an antenna coil in the contactless IC card.

In recent years, attention has been paid to an IC card having therein an IC such as a processor as a storage medium of electronic money or the like. There are two types of IC cards according to different signal transmitting methods. One is a contact IC card which receives power and clocks from a reader/writer as an upper terminal by using a contact point and processes a command from the reader/writer. The other is a contactless IC card 32 in which, as shown in FIG. 3, a coil 321 receives radio waves (electromagnetic waves) generated from a reader/writer 31 through a coil 311, transmitting and receiving data signals are generated, and a command transmitted from the reader/writer 31 is processed.

The contactless IC card includes a contact type having the communication distance of about few mm to 10 mm, a proximity type having the communication distance of tens mm, and a remote type having the communication distance of tens cm to few m. Among them, the contact IC card has the international standard ISO10536-2 in which the location and shape of the coils and the electric characteristics are defined.

According to the standard ISO10536-2, as shown in FIG. 3, page 2, ISO/IEC 10536-2:1995(E), two coils are arranged at an interval of 22 mm in a card and the inner size of the coils is defined as (11.6 mm×4 mm).

In order to reduce thickness, an IC card in which antenna coils are formed by printing a conductive paste (for example, silver paste) or the like on a PET film is used. As conventional techniques of the IC card obtained by printing the conductive paste, there are techniques described in Japanese Patent Application Laid-Open No. 8-216570, Japanese Patent Application No. 7-120237, and the like.

The method of forming the antenna coil of the IC card by printing the conductive paste (for example, a silver paste) or the like on a PET (polyethylene terephthalate) film of the conventional techniques have a problem that the conductance, that is, the value of resistance of the coil is larger than that of a coil made of a general copper wire and that of an etching coil on a printed board by one digit or more.

Specifically, in a coil having about 20 turns, although a direct current resistance of a coil formed by copper foil etching is 10 Ω or less, the resistance of a thick film printed coil formed by printing the silver paste or the like is 100 to 200 Ω. When power is received and a current flows, if the direct current resistance of the coil is large, the coil itself consumes the power. Consequently, a loss occurs and power efficiency deteriorates. It is therefore important to reduce the resistance of the thick film printed coil by widening the pattern line width of the coil as much as possible.

The coil is printed on the PET film in order to reduce the thickness of the card in the conventional techniques. When coils are printed on both of the surface and rear surface in order to increase the number of turns of the coils, there is a problem such that the antenna coils themselves have a self resonant frequency by a floating capacity (capacitor) occurring between the coils on the surface and rear surface and L (reactance) of the coils and an adverse influence may be exerted on a transmission frequency band. Specifically, the self resonant frequency by the floating capacity when the silver paste coils each having about 20 turns are formed on the PET film having the thickness of 50 $\mu$m is few MHz to tens MHz. Since the power and the communication frequency of the contact IC card conforming to ISO10536 are defined as 4.91 MHz, the self resonant frequency is a problem.

SUMMARY OF THE INVENTION

It is an object of the invention to provide a contact IC card in which a low-resistance antenna coil is formed by a conductive paste.

It is another object of the invention to reduce the direct current resistance and the floating capacity when an antenna coil in a card is formed by using a conductive paste in a contact IC card, especially, according to ISO10536 standard.

In order to achieve the objects, according to the first feature of the invention, as means for reducing the direct current resistance of the coils, means for partially widening the pattern line width of the coil in parts having dimensional room when the coils are formed is provided.

The second feature of the invention is realized in such a manner that when the coils are formed in two layers on the surface and the rear surface, as means for reducing the capacity between the coils, the coil on the surface and the coil on the rear surface are arranged so as not to be in overlapped positions and the wiring pattern of the coil on the rear side is arranged between the patterns of the coil on the surface.

The features of the invention will be more clearly described as follows.

According to a fundamental feature of the invention, as means for reducing the direct current resistance of the coil in a predetermined dimension, coupling areas are formed in the central parts on the surface and the rear surface of coil forming areas having predetermined dimensions on an insulating film, and antenna coils consisting of a pair of coils on the surface and the rear surface which have the turns in the same direction when seen from the outside and are connected via a though hole in an end part of the coupling areas are formed by a thick film printing method.

According to the feature, the low-resistant antenna coils each having the large number of turns can be formed in the coil forming areas of the predetermined dimensions. Since leads of the surface and rear surface coils formed so as to face each other on the surface and the rear surface of the insulating film are located on the outside of the coils, no leads traversing the coils are formed. Both of the pair of surface and rear surface coils can be formed in almost the same pattern and in the same winding direction on the insulating film, so that it is advantageous also from the viewpoint of manufacturing.

According to another feature of the invention, by forming two or more pairs of the surface and rear coils on the insulating film, connection between the pairs of coils (antenna coils) and external circuits and connection between the antenna coils can be performed on the outside of the coils.

According to another feature of the invention, in the fundamental feature, the coil forming area is a rectangle and the line width of the coil pattern in the longitudinal direction of the coil forming area is formed so as to be wider. According to the feature, the direct current resistance of the coil can be further reduced.

According to further another feature of the invention, in the fundamental feature, the patterns of the surface and rear surface coils of the pair of coils are formed so as to be deviated from each other at a half pitch. According to the feature, the floating capacity between both of the coils can be remarkably reduced.

According to the invention, in a contactless IC card in which coils are printed by a conductive paste, the direct current resistance of the antenna coils can be reduced and the adverse influence on the communication by the self resonance of the coils can be reduced, so that there is an effect that the transmission efficiency of power and signals is improved.

The above and other objects and features of the invention will become more apparent from the following description of the embodiments with reference to the accompanying drawings.

DETAILED DESCRIPTION OF THE PREFERRED EMBODIMENTS

Figure 1:
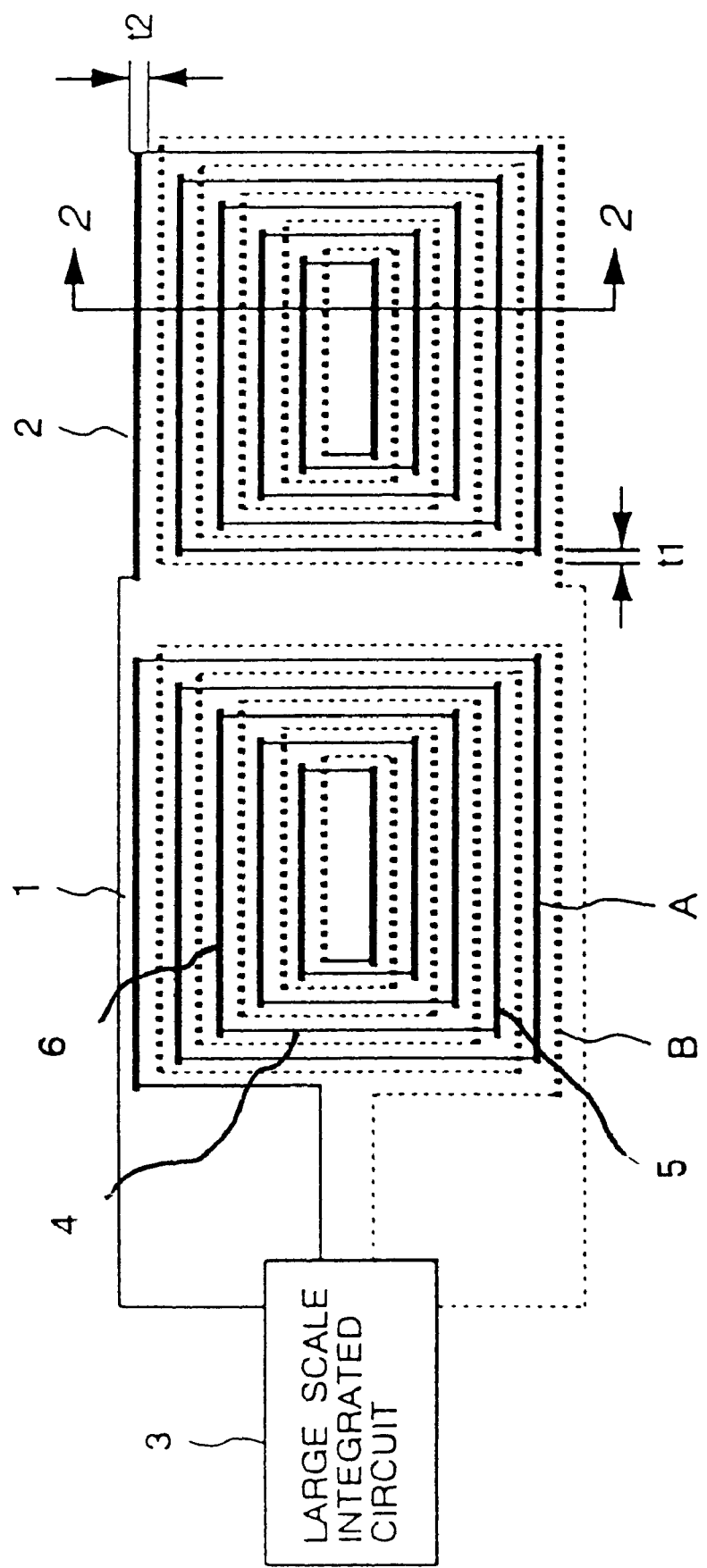
FIG. 1 is a plan view showing the shape of coils according to an embodiment of the invention.
Figure 2:
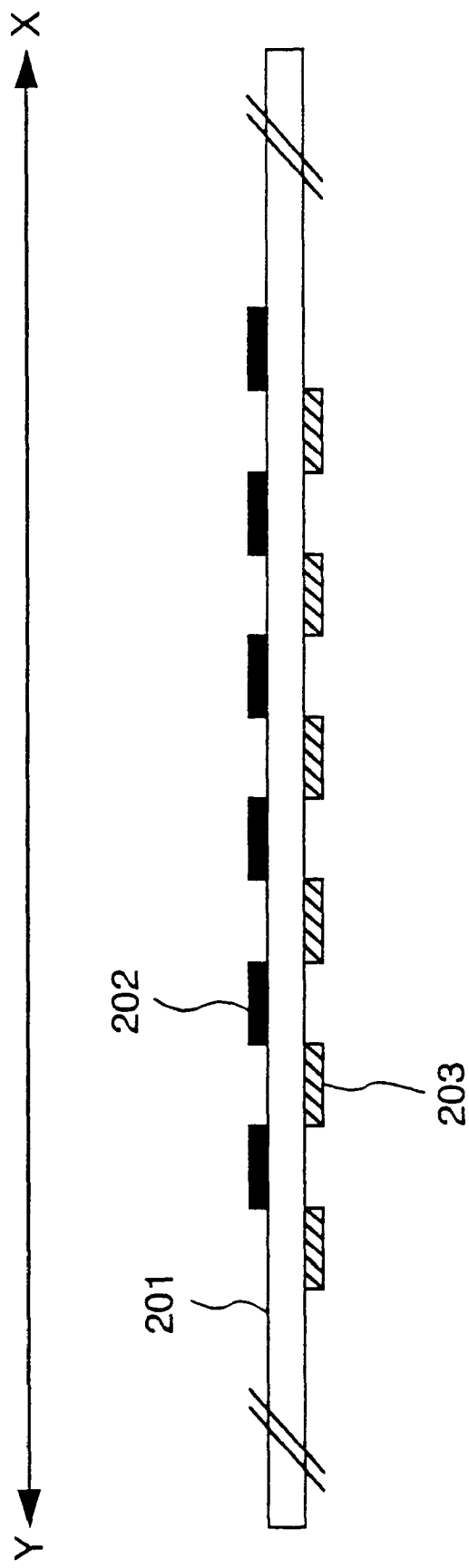
FIG. 2 is a diagram showing a section of a part of the coil according to an embodiment of the invention.

FIG. 1 is a diagram showing the shape of coils of the invention. FIG. 2 is a cross section of the coil shape of FIG. 1.

The circuit construction of a contactless IC card will be first described.

Figure 3:
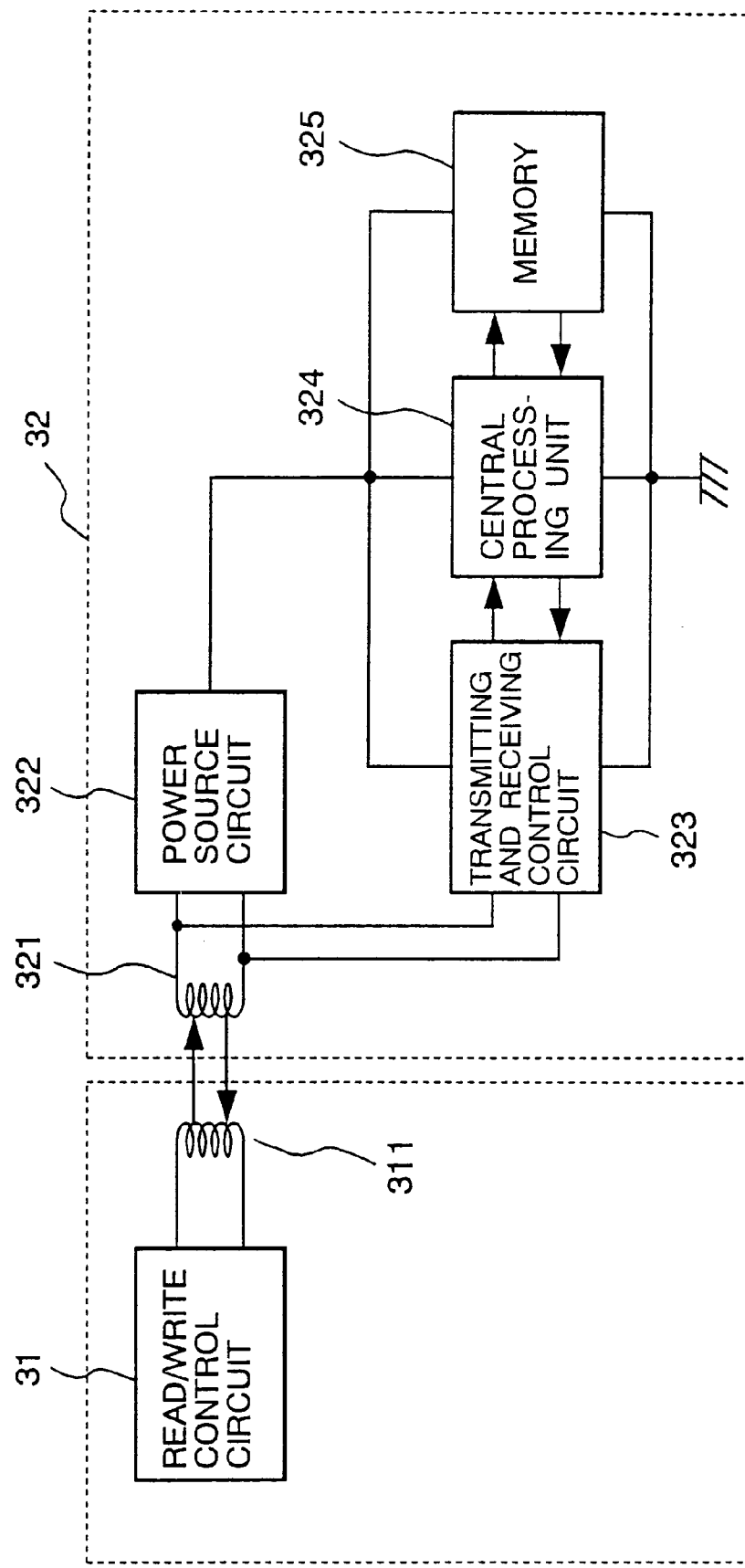
FIG. 3 is a block diagram showing the circuit construction of a contactless IC card.

FIG. 3 is a block diagram showing the circuit construction of the contactless IC card. In the contactless IC card, power and signals are transmitted and received between a coil 311 in a read/write control circuit 31 in a reader/writer (R/W) and a coil 321 in an IC card 32 having a communication control circuit by electromagnetic coupling. The IC card 32 comprises: a power source circuit 322 for generating a power voltage from an electromagnetic wave signal received by the coil 321; a transmitting and receiving control circuit 323 for controlling modulation/demodulation and transfer of the transmitted and received signals; a central processing unit (CPU) 324; and a memory 325.

Figure 6:
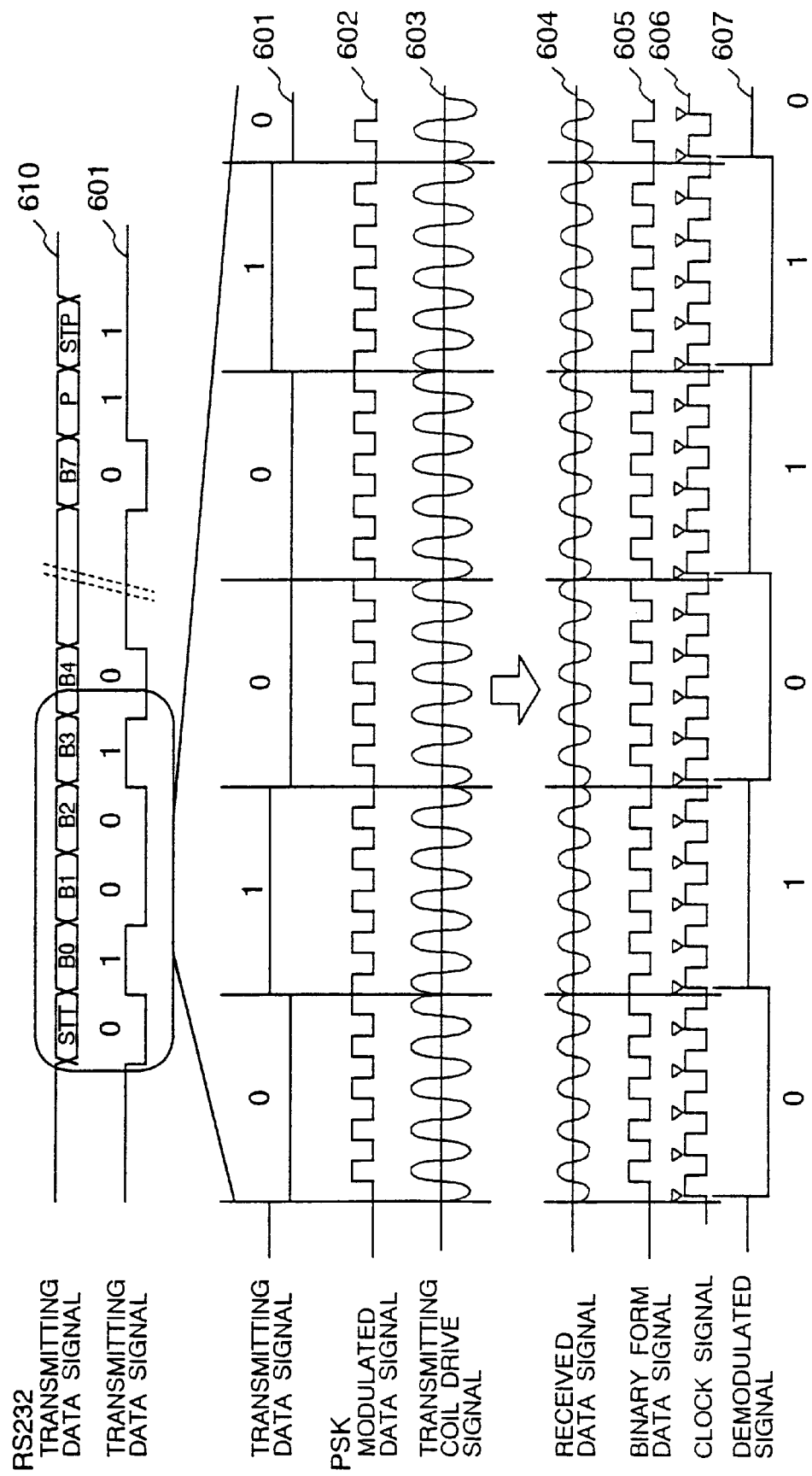
FIG. 6 is a waveform diagram showing data transmitting and receiving operation.

An embodiment of a data transmitting/receiving method between the read/write control circuit 31 and the IC card 32 will be described with reference to FIG. 6.

For example, with respect to a transmitting data signal, an RS232 transmitting data signal 610 is supplied from a CPU or the like to the read/write control circuit 31 and becomes a transmitting data signal 601. The transmitting data signal 601 is a serial signal and a logical signal of 0 and 1 and performs phase modulation (PSK modulation) of 180° to a carrier (4.91 MHz) signal. A PSK modulated data signal 602 passes through a filter circuit and the like, becomes a transmitting coil drive signal 603, and drives the transmitting coil 311.

On the other hand, on the IC card side, a received data signal 604 is obtained by the reception coil 321 electromagnetically connected to the coil on the transmitting side. The received data signal is converted to a binary form data signal 605 and processes such as demodulation are performed by the digital signal. A clock signal 606 is generated by using the binary form data signal 605 as a reference. By sampling the binary form data signal 605 at the leading edges of the clock signal 606, a demodulated signal 607 is obtained.

Figure 4:
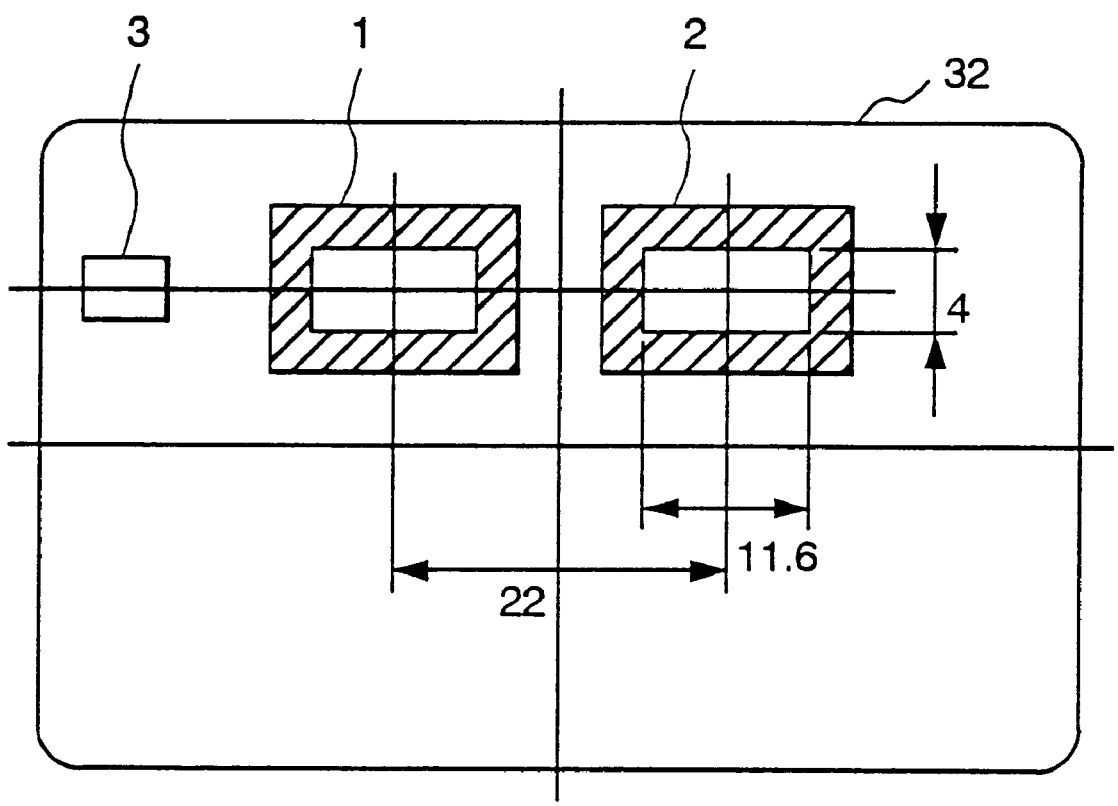
FIG. 4 is a diagram showing the construction of an IC card conforming to ISO10536.

The layout of the IC card according to the invention is as shown in FIG. 4 so as to follow ISO10536. The IC card 32 is constructed by an LSI 3 and coils 1 and 2. The LSI 3 has circuits 322 to 325 in FIG. 3. The coils 1 and 2 correspond to the coil 321 in FIG. 3. According to ISO10536, an area for transmitting and receiving signals is determined by two coils (coils 1 and 2) arranged at an interval of 22 mm (in the outer size of the coils) as shown in FIG. 4. The dimension of a coupling area in the coil is defined as about 11.6 mm×4 mm from the relation with the reader/writer. Therefore, when the coils have to be formed in limited coil forming areas by printing means on a card, if the number of turns of the coil is large, it is necessary to narrow the line width of the printing pattern.

Figure 5:
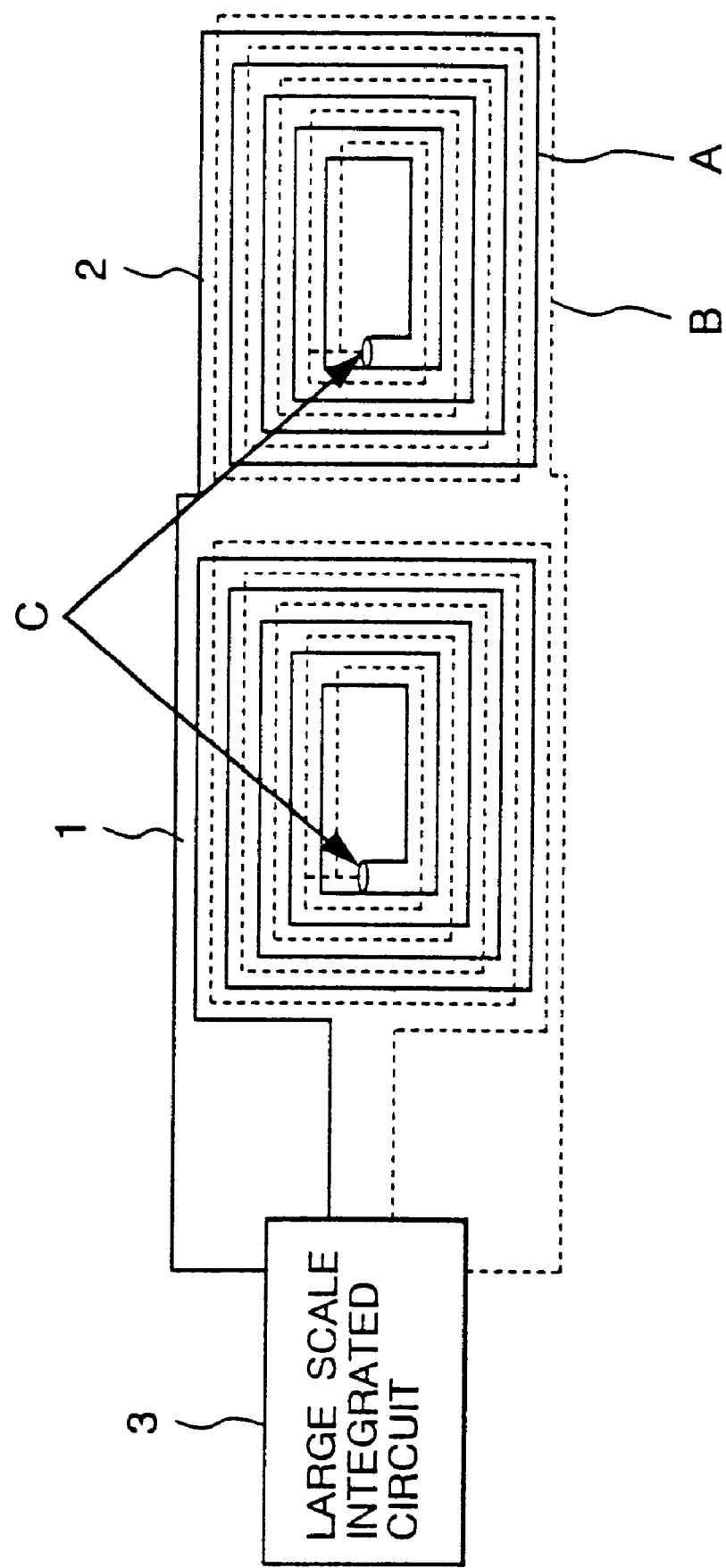
FIG. 5 is a plan pattern diagram of two antenna coils formed by silver paste printing.

FIG. 5 is a detailed diagram showing an example of two coils formed by silver paste printing. Each of the coils 1 and 2 is constructed by total 10 turns of five turns each on the surface and rear face. A solid line A shows the pattern on the surface and a broken line B shows the pattern on the rear face. The patterns on the surface and the rear face are connected via a through hole at a point C on the inner side of the coil. The silver paste coil has the pattern width of 150 $\mu$m, the thickness 20 of $\mu$m, and the pattern interval of 300 $\mu$m.

Generally, since the conductance of the silver paste coil is smaller than that of an etching coil or a winding coil by 10 to 20 times, there may be a problem of an impedance (internal resistance).

That is, when the pattern width of the printed coil is narrowed, the impedance (resistance) of the coil increases and the power is not easily obtained. Especially, when a conductive paste such as silver paste is used, the value of resistance in case of a coil having 20 turns and the line width of 150 $\mu$m is around 200 $\Omega$ and large, which is much larger than that of the etching coil. The internal resistance of the coil is a loss when the power is obtained. When the consuming current of the IC card on which a CPU is mounted is, for example, about 3V/10 mA, the power is 30 mW, and the loss by the coil is 20 mW. It is an order which cannot be ignored.

FIG. 1 is a diagram showing a preferred embodiment of the invention. In FIG. 1, wiring line width t1 in the vertical direction of the antenna coils 1 and 2 having the coupling areas in the center has the line width of 150 $\mu$m which is the same as that of FIG. 5 and the wiring line width t2 in the lateral direction is 300 $\mu$m which is greater than t1. For example, as shown in FIG. 1, a first portion 6 of the coil intersects a second portion 4 of the coil and has a width greater than the second portion 4 of the coil, A third portion 5 which intersects the opposite end of the second portion 4 from the first portion 6 has a width that is equal to the first portion 6 and greater than the second portion 4. Therefore, the line width along one direction is greater than the line width along a second direction perpendicular to the first direction. The pattern in the vertical direction along the short side of the rectangular coupling are cannot be widened, because if it is widened, the coils 1 and 2 are short-circuited. The pattern in the lateral direction has dimensional room in the ISO standard and can be widened. The widths of the patterns in the vertical and lateral directions are varied as mentioned above, thereby enabling the impedance of the whole antenna coils to be further reduced.

FIG. 2 is a cross sectional view taken on line 2—2 of the antenna coil 2 in FIG. 1. Reference numeral 201 denotes a PET film having the thickness of 50 µm; 202 a silver paste printed coil on the surface; and 203 a silver paste printed coil on the rear face. In case of the printed coil using the PET film, the thickness of the film is thinner than that in case of performing an etching to a general substrate, so that a large floating capacity occurs. When the coil wiring on the surface and rear face are arranged in facing positions, the floating capacity occurs between the wiring on the surface and that on the rear face, and the floating capacity and the coil form a resonant circuit. When the resonant frequency is almost equal to the communication frequency, an adverse influence is exerted.

According to experiments, the self resonant frequency in case of the above coil construction lies in a range from few MHz to tens MHz. The communication frequency of the power and signals of the contact IC card according to ISO10536 is defined as 4.91 MHz, so that the self resonant frequency is a problem.

FIG. 2 shows the antenna coil constructed so as to reduce the influence of the floating capacity. As shown in the diagram, in order to reduce the floating capacity occurring between the coils on the surface and the rear surface, the coil on the surface and the coil on the rear face are arranged to deviate from each other at a 1/2 pitch so as not to be in overlapped positions. The wiring pattern 203 of the coil on the rear side is arranged between the wiring of the coil pattern 202 on the surface.

Figure 7:
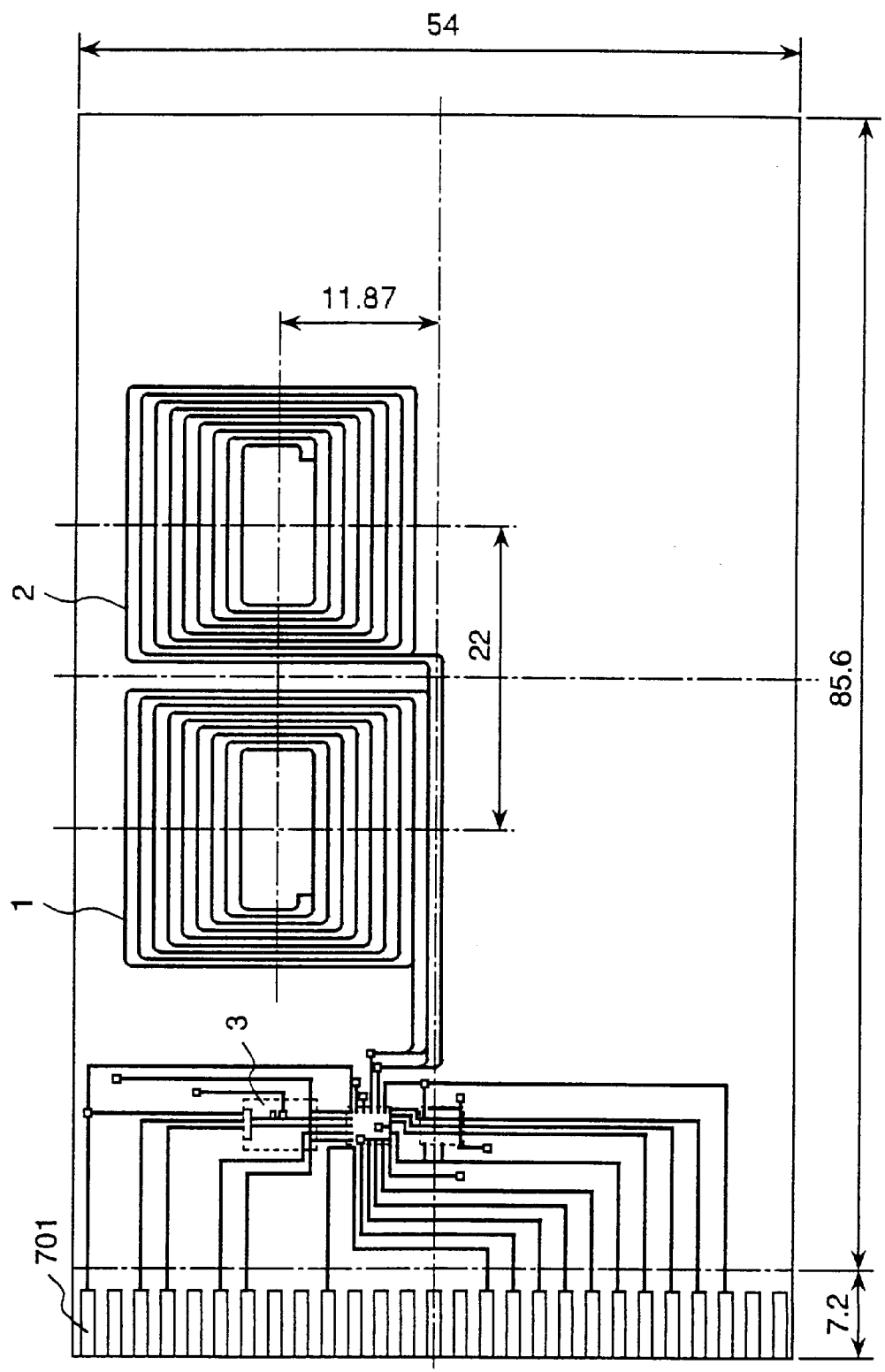
FIG. 7 is a plan view illustrating the whole substrate of an IC card being fabricated.

FIG. 7 is a diagram showing the whole substrate (PET film substrate) of the IC card employing the invention. The dimension in the lateral direction of the antenna coils 1 and 2 is larger than that in the vertical direction. An integrated circuit is mounted in a position shown by 3. Further, a terminal 701 is a test terminal for a circuit debug and is cut when the IC card is completed.

What is claimed is:

1. A contactless IC card having an IC circuit and an antenna coil and for transferring power, the antenna coil in the contactless IC card being formed by printing, wherein the antenna coil in the contactless IC card generally lies along a plurality of first directions and a plurality of second directions, the first and second directions being perpendicular to each other, and a line width of the antenna coil along the first directions is greater than a line width of the antenna coil along the second direction.

2. The contactless IC card according to claim 1, wherein when two antenna coils are formed on a front surface and a rear surface, which is opposite the front surface of the contactless IC card, to increase the number of turns of coils, the coil on the surface and the coil on the rear surface are arranged so as not to be in overlapped positions and a wiring pattern of the coil on the rear surface is arranged between a wiring pattern of the coil on the surface.

3. The contactless IC card according to claim 1, wherein a coil forming area is a rectangle and a line width of the coil pattern in a longitudinal direction of the coil forming area is formed so as to be wider.

4. The contactless IC card according to claim 1, wherein patterns of the coils on the surface and the rear surface of the pair of coils are formed so as to be deviated from each other at a half pitch.

5. A contactless IC card having an IC circuit and an antenna coil connected to said IC circuit, wherein said coil comprises:

a first portions positioned along a plurality of first direction and a plurality of second portions positioned along a second direction which is perpendicular to the first direction, wherein a pitch of the coil in the first portions is larger than a pitch of the coil in the second portions and the coil in said first portions has a larger width than the coil in said second portions.

6. A contactless IC card as defined in claim 5, wherein said coil is formed by use of a conductive paste in an insulating film.

7. A contactless IC card as defined in claim 6, further comprising a plurality of coils, similar to said coil, formed on said insulating film.

8. A contactless IC card as defined in claim 7, wherein said plurality of coils are formed on both surfaces of said insulating film.

9. A contactless IC card as defined in claim 7, wherein said first direction is along a lateral direction of said IC card, and said second direction is along a vertical direction of said IC card.

10. A contactless IC card as defined in claim 6, wherein the antenna coil further comprises a third portion positioned along the first direction and intersecting the second portion, and wherein the width of the coil in the third portion is greater than the width of the coil in the second portion.

11. A contactless IC card having an IC circuit and an antenna coil connected to said IC circuit, wherein said coil comprises:

a first portions positioned along a plurality of first direction and a plurality of second portions positioned along a second direction which is perpendicular to the first direction, wherein the coil in said first portions has a larger width than the coil in said second portion.

12. A contactless IC card as defined in claim 11, wherein said coil is formed by use of a conductive paste in an insulating film.

13. A contactless IC card as defined in claim 12, wherein said first direction is along a lateral direction of said IC card, and said second direction is along a vertical direction of said IC card.

14. A contactless IC card as defined in claim 11, further comprising a plurality of coils, similar to said coil, formed on said insulating film.

15. A contactless IC card as defined in claim 11, wherein said plurality of coils are formed on both surfaces of said insulating film and are arranged so as not to overlap one another.

16. A contactless IC card as defined in claim 11, wherein the antenna coil further comprises a third portion positioned along the first direction and intersecting the second portion, and wherein the width of the coil in the third portion is greater than the width of the coil in the second portion.

17. A contactless IC card having an IC circuit and an antenna coil formed during a printing process with a single material, the antenna coil being connected to the IC circuit and comprising a first portions positioned along a plurality of first direction and a plurality of second portions intersecting the first portion and positioned along a second direction different from the first direction, the width of the coil in the first portions being greater than the width of the coil in the second portions.

18. A contactless IC card as defined in claim 17, wherein the antenna coil further comprises a third portion positioned along the first direction and intersecting the second portion, and wherein the width of the coil in the third portion is greater than the width of the coil in the second portion.

* * * * *